(12) United States Patent
Johnson et al.

(10) Patent No.: US 10,488,762 B1
(45) Date of Patent: Nov. 26, 2019

(54) METHOD TO REDUCE DATA STREAM FOR SPATIAL LIGHT MODULATOR

(71) Applicant: Applied Materials, Inc., Santa Clara, CA (US)

(72) Inventors: Joseph R. Johnson, Redwood City, CA (US); Thomas L. Laidig, Richmond, CA (US); Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/024,062

(22) Filed: Jun. 29, 2018

(51) Int. Cl.
*G03B 27/42* (2006.01)
*G03F 7/20* (2006.01)
*G02F 1/13* (2006.01)

(52) U.S. Cl.
CPC .......... *G03F 7/7005* (2013.01); *G02F 1/1303* (2013.01); *G03F 7/7015* (2013.01); *G03F 7/70375* (2013.01)

(58) Field of Classification Search
CPC ....... G09G 2310/08; G09G 2320/0233; G09G 3/3233; G09G 3/3258; G09G 3/3266; G09G 2300/0426; G09G 2300/0452; G09G 3/3208; G09G 3/3275; G09G 3/32; G09G 2310/0264; G09G 2310/0289; G09G 2320/0646; G09G 3/3406; H01L 27/3211
See application file for complete search history.

(56) References Cited

U.S. PATENT DOCUMENTS

| 2006/0114546 | A1 | 6/2006 | Cebuhar et al. |
| 2010/0117997 | A1 | 5/2010 | Haase |
| 2010/0220306 | A1 | 9/2010 | Malach et al. |
| 2014/0160452 | A1* | 6/2014 | De Jager ............. G03F 7/70375 355/53 |
| 2016/0035265 | A1* | 2/2016 | Park ..................... G09G 3/2003 345/694 |
| 2017/0138562 | A1 | 5/2017 | Western et al. |
| 2018/0156898 | A1 | 6/2018 | Suzuki et al. |

FOREIGN PATENT DOCUMENTS

KR  10-2016-0007205 A  1/2016

OTHER PUBLICATIONS

PCT Notification of Transmittal of the International Search Report and the Written Opinion of the International Searching Authority for International Application No. PCT/US2019/033482; dated Sep. 9, 2019; 10 total pages.

* cited by examiner

*Primary Examiner* — Mesfin T Asfaw
(74) *Attorney, Agent, or Firm* — Patterson + Sheridan LLP

(57) ABSTRACT

Embodiments of the present disclosure provide improved photolithography systems and methods using a solid state emitter array. The solid state emitter array comprises solid state emitter devices arranged in rows and columns, wherein each solid state emitter device comprises two or more subpixels. Each solid state emitter device comprises one program gate which may transmit a voltage to a state storage node. The state storage node is in electrical communication with a drive gate. The drive gate is in communication with two or more solid state emitter subpixels. The arrangement of a plurality of subpixels in communication with a single drive gate allows more than one pulse to be delivered to the drive gate, resulting in illumination of more than one subpixel at each drive gate. The redundancy results in improved data efficiency.

20 Claims, 8 Drawing Sheets

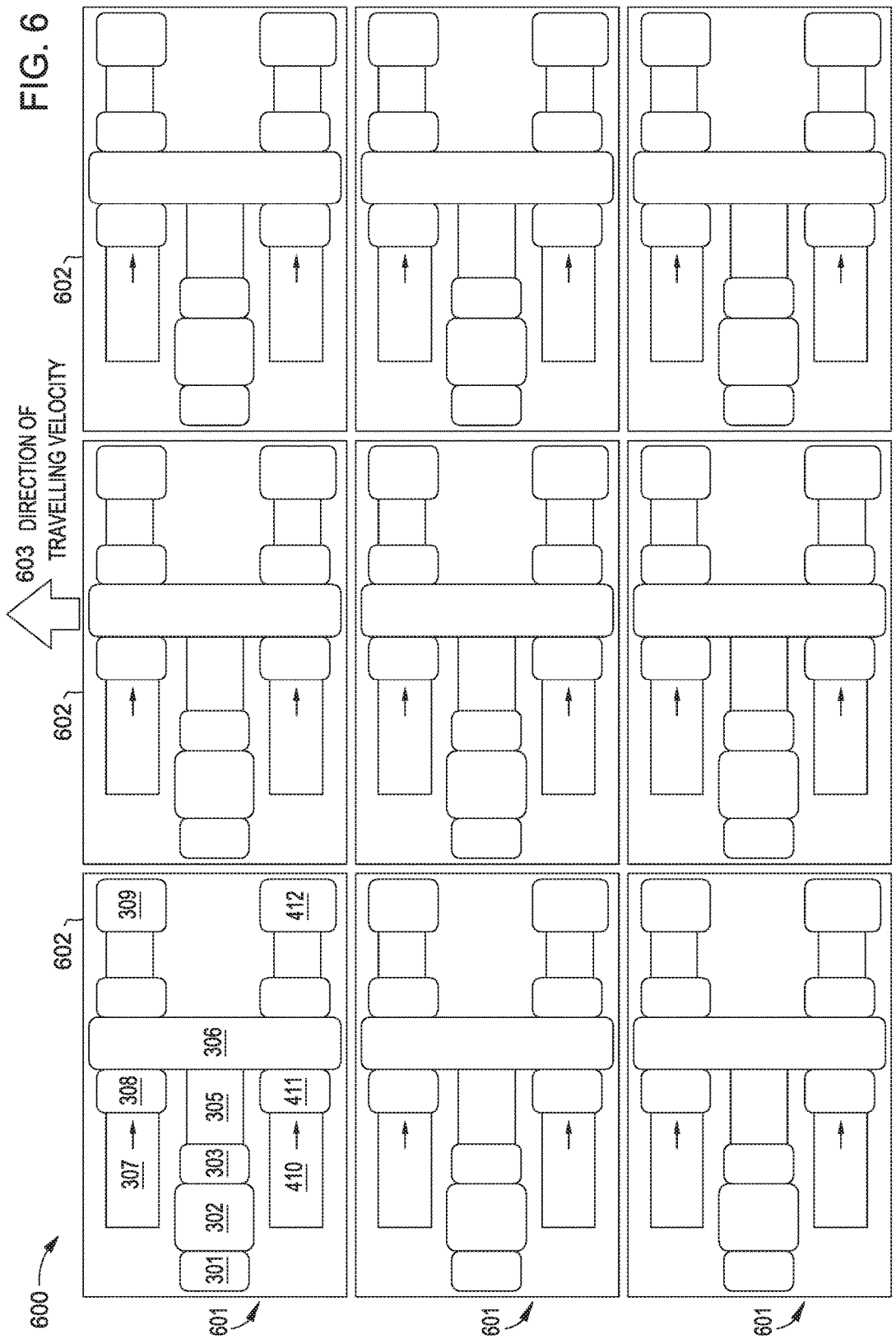

METHOD TO REDUCE DATA STREAM FOR SPATIAL LIGHT MODULATOR

BACKGROUND

Field

Embodiments of the present disclosure generally relate to apparatuses, systems and methods for processing one or more substrates, and more specifically to apparatuses, systems and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

SUMMARY

Embodiments of the present disclosure generally provide improved photolithography systems and methods using a solid state emitter device. In one embodiment, the solid state emitter device comprises a program gate configured to deliver a voltage; a state storage node electrically connected to the program gate, wherein the state storage node is configured to store a voltage delivered by the program gate; a drive gate electrically connected to the state storage node; at least two power lines electrically connected to the drive gate; and a pixel comprising at least two subpixels, wherein each subpixel is electrically connected to the drive gate; wherein the drive gate is configured to transmit the voltage stored in the state storage node to a first subpixel upon delivery of a first electrical pulse from a first power line to the drive gate; and the drive gate is configured to transmit the voltage stored in the state storage node to a second subpixel upon delivery of a second electrical pulse from a second power line to the drive gate; and wherein delivery of an electrical pulse to a subpixel causes illumination of the subpixel.

In another embodiment, a solid state emitter array for patterning a substrate is disclosed. The solid state emitter array comprises a plurality of solid state emitter devices, wherein each solid state emitter device comprises a program gate configured to deliver a voltage; a state storage node electrically connected to the program gate, wherein the state storage node is configured to store a voltage delivered by the program gate; a drive gate electrically connected to the state storage node; at least two power lines electrically connected to the drive gate; and a pixel comprising at least two subpixels, wherein each subpixel is electrically connected to the drive gate; wherein the drive gate is configured to transmit the voltage stored in the state storage node to a first subpixel upon delivery of a first electrical pulse from a first power line to the drive gate; and the drive gate is configured to transmit the voltage stored in the state storage node to a second subpixel upon delivery of a second electrical pulse from a second power line to the drive gate; and wherein delivery of an electrical pulse to a subpixel causes illumination of the subpixel.

In another embodiment, a method for patterning a substrate using a solid state emitter device is disclosed. In this embodiment, the substrate is configured to move past the solid state emitter device at a velocity. The method comprises transmitting a voltage to a program gate connected to a state storage node; transmitting the voltage from the program gate to the state storage node; storing the voltage in the state storage node; transmitting a first electrical pulse from a first power line to a drive gate, wherein the transmission of the first electrical pulse causes the voltage stored in the state storage node to pass through the drive gate and illuminate a first subpixel; and transmitting a second electrical pulse from a second power line to the drive gate, wherein the transmission of the second electrical pulse causes the voltage stored in the state storage node to pass through the drive gate and illuminate a second subpixel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 is a flow chart of a method of patterning a substrate according to embodiments disclosed herein.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure provide improved photolithography systems and methods using a microLED array. The microLED array comprises solid state emitter devices arranged in rows and columns, wherein each solid state emitter device comprises two or more subpixels. Each solid state emitter device comprises one program gate which may transmit a voltage to a state storage node. The state storage node is in electrical communication with a drive gate. The drive gate is in communication with two or more subpixels. The arrangement of a plurality of subpixels in communication with a single drive gate allows more than one pulse to be delivered to the drive gate, resulting in illumination of more than one subpixel at each drive gate. The result includes gains in data efficiency, an improved signal-to-noise ratio, and improved resolution of substrate patterning.

Figure 1A:
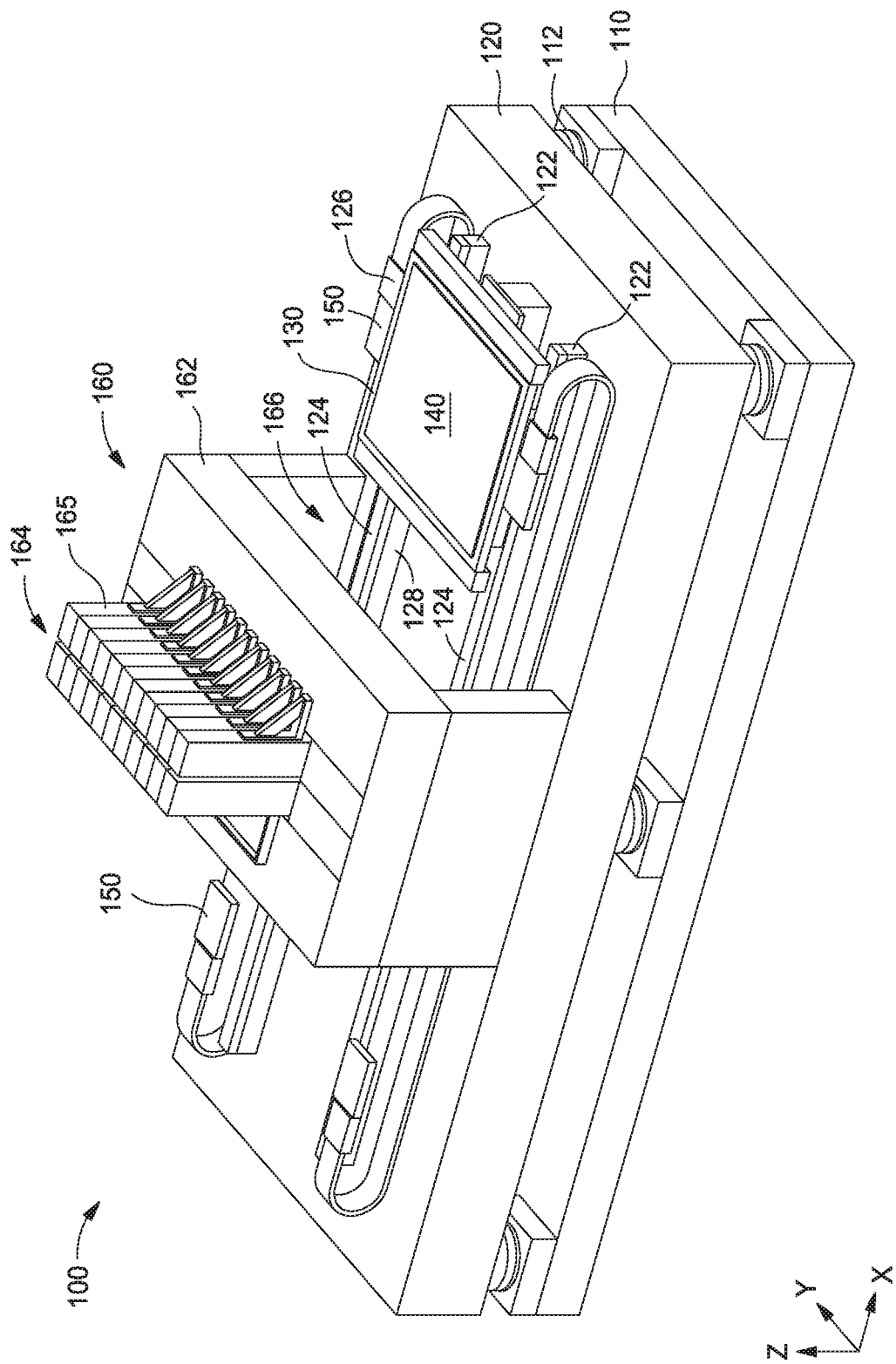
FIG. 1A is a perspective view of a photolithography system according to embodiments disclosed herein.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, 271, shown in FIGS. 2A-2B. These techniques may be used in combination.

Figure 1B:
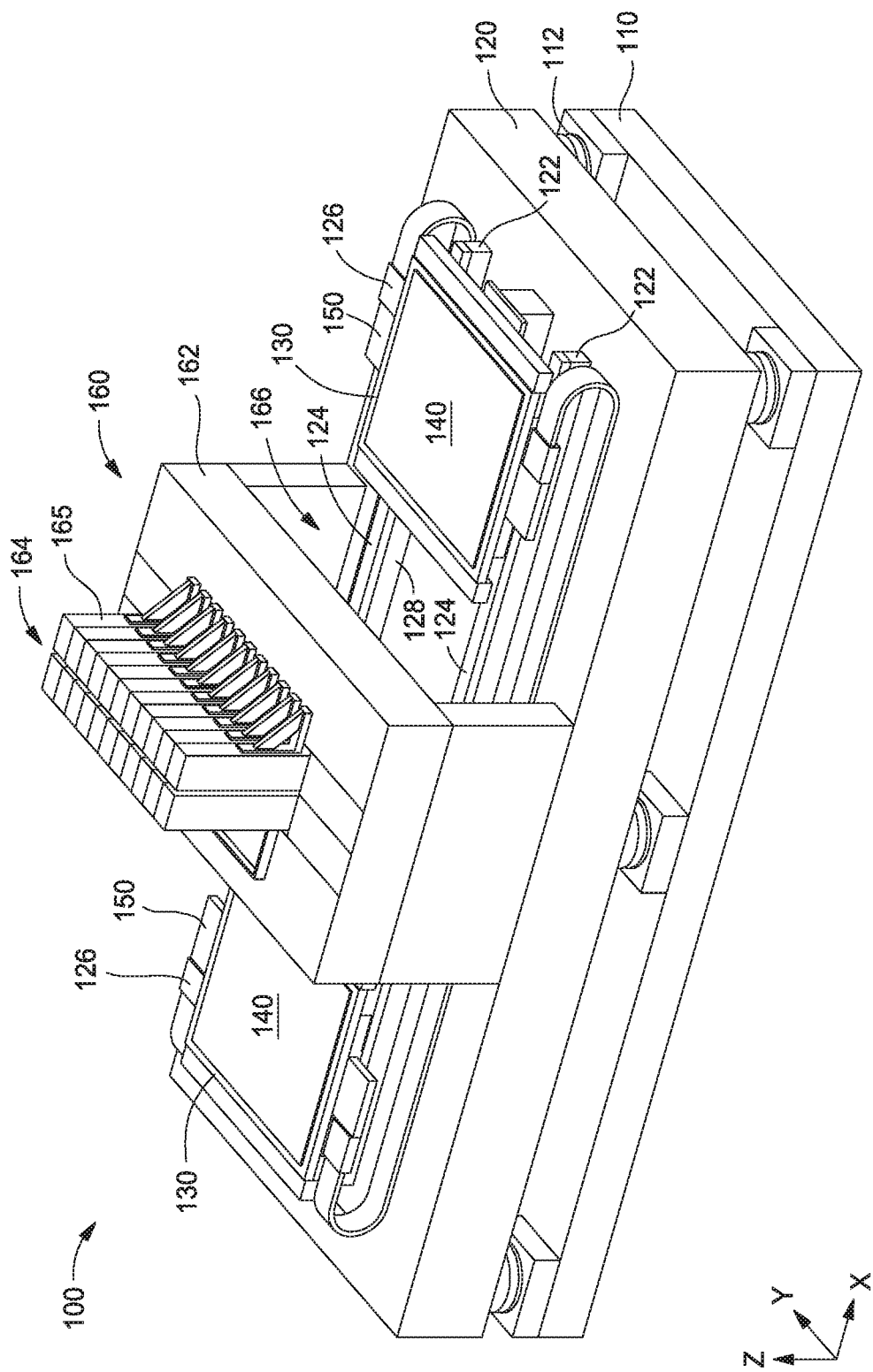
FIG. 1B is a perspective view of a photolithography system according to embodiments disclosed herein.

FIG. 1B is a perspective view of a photolithography system 200 according to embodiments disclosed herein. The system 200 is similar to the system 100; however, the system 200 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
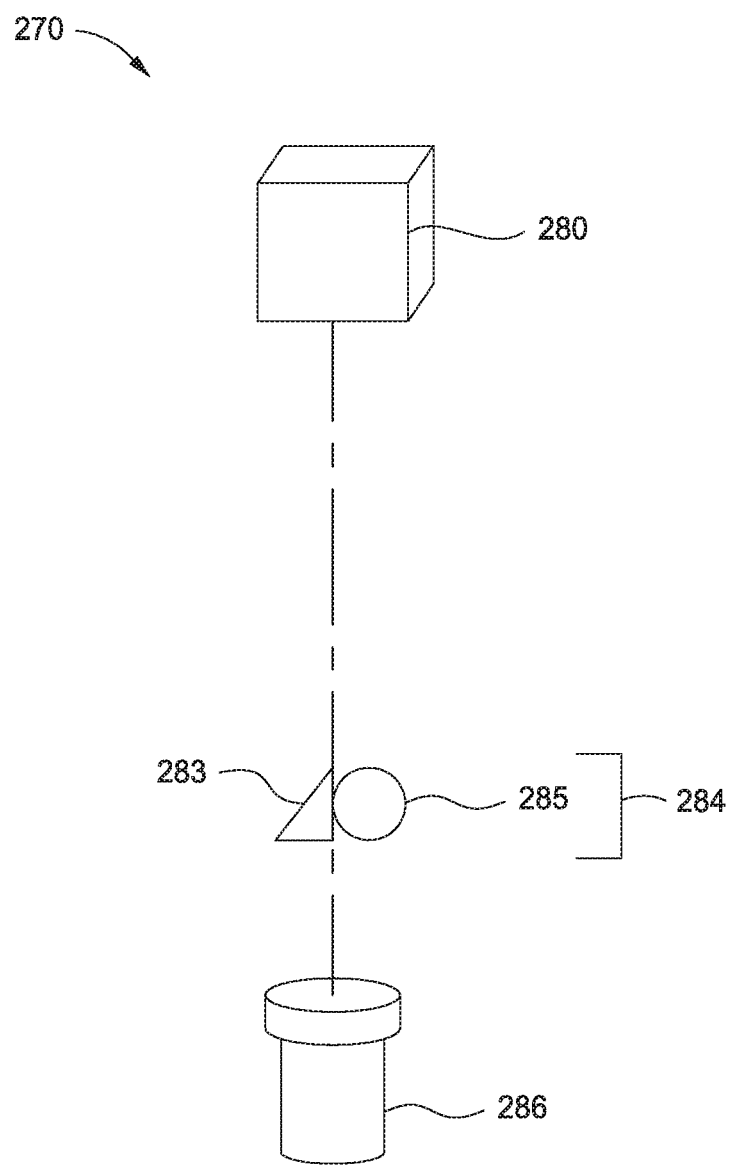
FIG. 2A is a perspective schematic view of an image projection apparatus according to embodiments disclosed herein.

FIG. 2A is a perspective schematic view of an image projection apparatus 270 according to one embodiment, which is useful for a photolithography system, such as system 100 or system 200. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs), liquid crystal displays (LCDs), and vertical-cavity surface-emitting lasers (VCSELs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 200 is correct or within an predetermined tolerance. The projection optics 286, such as one or more lenses, is used to project the light onto the substrate, such as the substrate 140.

Figure 2B:
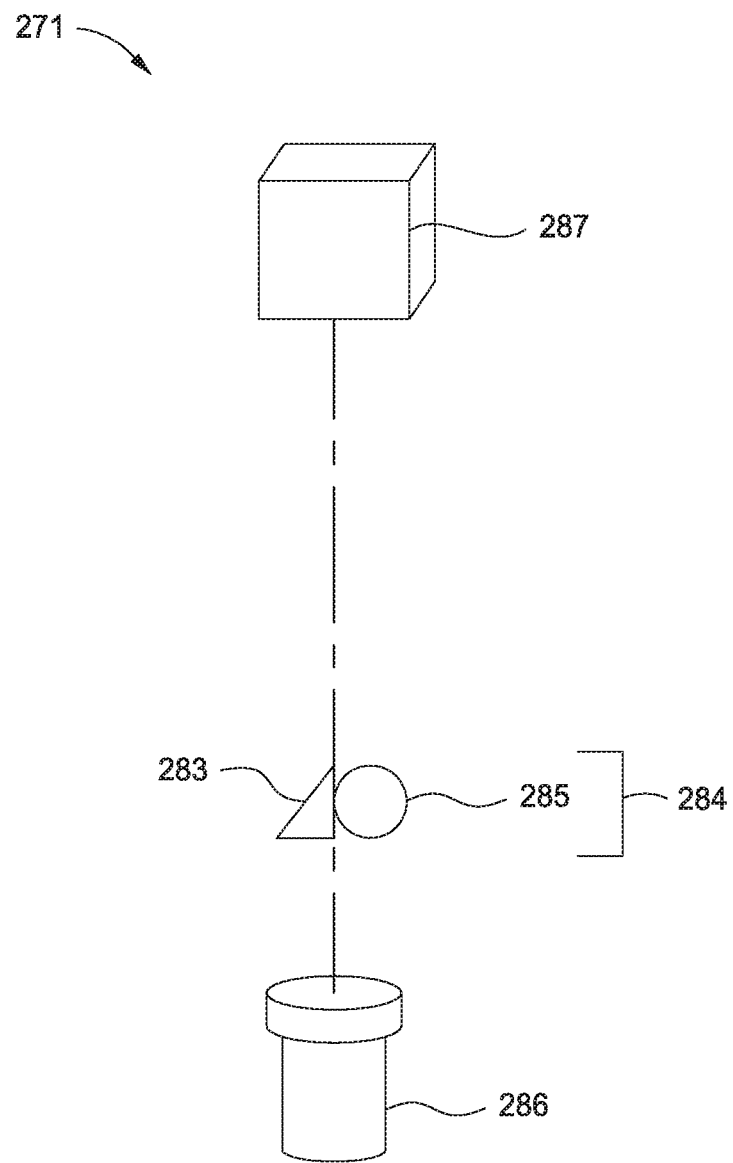
FIG. 2B is a perspective schematic view of an image projection apparatus according to embodiments disclosed herein.

FIG. 2B is an image projection apparatus 271 according to embodiments described herein. In the embodiment shown in FIG. 2B, the image projection apparatus 271 includes one or more solid state emitter devices 287 as the spatial light modulator(s), a focus sensor and camera system 284 and projection optics 286. Solid state emitter devices 287 are microscopic (for example, less than about 100 µm) devices that emit electromagnetic radiation. Solid state emitter devices 287 may be arranged in an array and used to form the individual pixels of a substrate, such as a display device. Since solid state emitter devices are self-emitting, they inherently function as a spatial light modulator; a discrete outside light source is not needed in the image projection apparatus 271.

In embodiments using microLEDs, the camera 285 is also useful to measure the image pixel pitch of the one or more solid state emitters to calibrate for any thermal expansion happening at the solid state emitter device.

Figure 3:
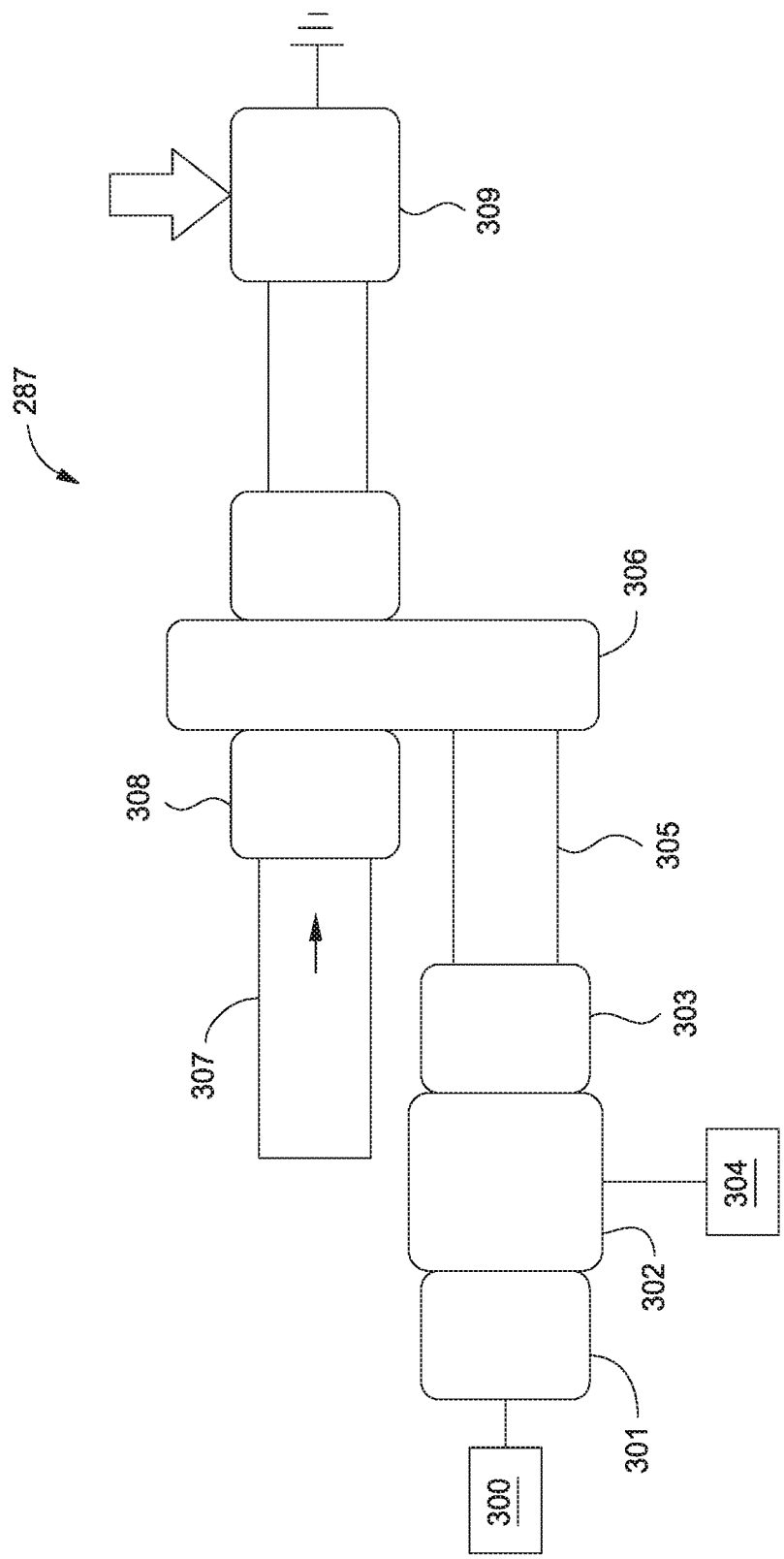
FIG. 3 is a schematic view of a solid state emitter device.

FIG. 3 is a schematic view of an active matrix solid state emitter device 287. The solid state emitter device 287 comprises a program source 301, a program gate 302 and program drain 303. Program source 301 is electrically connected to a voltage source 300. The program gate 302 is electrically connected with a solid state programming device 304. The program drain 303 is electrically connected to a state storage node 305. State storage node 305 is electrically connected to a drive gate 306. A first power line 307 is electrically connected to a first source 308. First source 308 is electrically connected to drive gate 306. Drive gate 306 is electrically connected to first subpixel 309.

The use of the active matrix solid state emitter device to pattern a substrate is characterized by two phases. In the first phase, programming device 304 determines whether program gate 302 is turned on or turned off. Voltage source 300 applies a voltage to program source 301. If program gate 302 is turned off by programming device 304, the voltage is not stored. If program gate 302 is turned on by programming device 304, current flows through program gate 302, through program drain 303, and is stored in state storage node 305. Voltage source 300 is then turned off. In the second phase, a pulse is applied via first power line 307. If the state storage node 305 has a stored voltage, the drive gate 306 transmits the current from first power line 307 to first subpixel 309, resulting in illumination of first subpixel 309, which in turn projects light onto substrate. Alternatively, if state storage node 305 has no storage voltage, then drive gate 306 transmits no current from first power line 307 to subpixel 309, resulting in no illumination of subpixel 309, and no projection of light onto substrate. Illumination or non-illumination of the subpixels results in patterning of the substrate.

Because each storage node is linked to a single pulse and a single pixel, the precision of the patterning is limited by the size of the pixel. Some patterns may have features that are smaller than the size of a single pixel. The existing system would be unable to capture the details of these small features. Further, the existing system does not provide for redundancies to reduce or average out errors.

Figure 4:
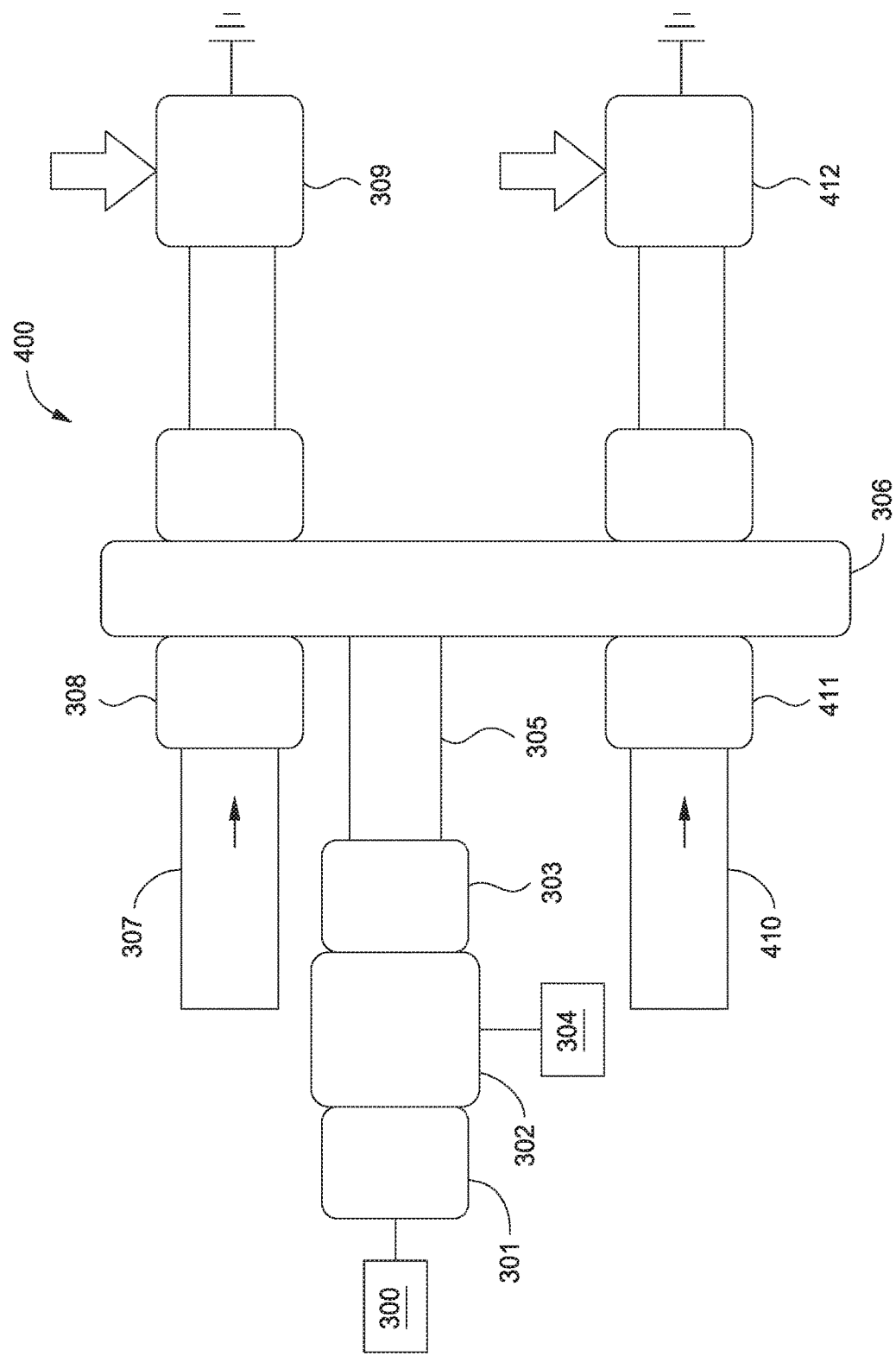
FIG. 4 is a schematic view of active matri microLED device according to embodiments disclosed herein.

FIG. 4 is a schematic view of an active matrix solid state emitter device 400 according to embodiments disclosed herein. Active matrix solid state emitter device 287 comprises a program source 301, a program gate 302 and program drain 303. Program source 301 is electrically connected to a voltage source 300. The program gate 302 is electrically connected to a solid state programming device 304. The program drain 303 is electrically connected to a state storage node 305. State storage node 305 is electrically connected to a drive gate 306. First power line 307 is electrically connected to a first source 308. The first source 308 is electrically connected to drive gate 306. Drive gate 306 is electrically connected to first subpixel 309. Second power line 410 is electrically connected to second source 411. Second source 411 is electrically connected to drive gate 306. Drive gate 306 is electrically connected to second subpixel 412.

Figure 5:
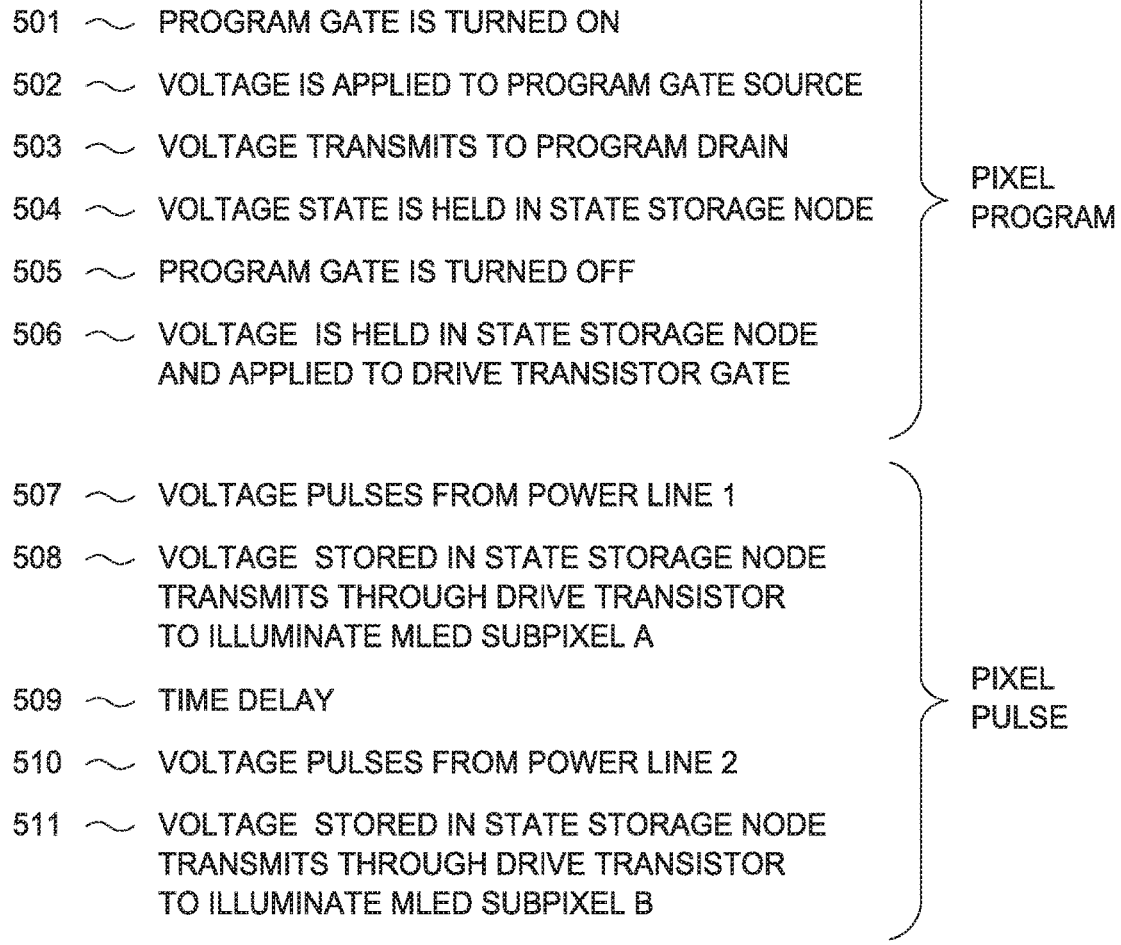
FIG. 5 is a schematic view of a microLED array according to embodiments disclosed herein.

FIG. 5 is a flow chart of a method of patterning a substrate according to embodiments disclosed herein. The use of this method is characterized by two phases. In the first phase, programming device 304 determines whether program gate 302 is turned on or turned off. If in 501 the program gate is turned on, then in 502 the voltage source 300 applies a voltage to program source 301. If program gate 302 is turned off by programming device 304, the voltage is not stored. In 503, if program gate 302 is turned on by programming device 304, current flows through program gate 302 to program drain 303. In 504 voltage is stored in state storage node 305. In 505 voltage source 300 is then turned off. In 506 voltage is held in state storage node 305 and applied to drive gate 306.

In the second phase, in 507, a pulse is applied via first power line 307. In 508, if the state storage node 305 has a stored voltage, the drive gate 306 transmits the current from first power line 307 to first subpixel 309, resulting in illumination of first subpixel 309, which in turn projects light onto substrate. Alternatively, if state storage node 305 has no stored voltage, then drive gate 306 transmits no current from first power line 307 to first subpixel 309, resulting in no illumination of first subpixel 309, and no projection of light onto substrate. In 509 a time delay occurs. In 510, a second pulse is applied via second power line 410. In 511, if the state storage node 305 has a stored voltage, the drive gate 306 transmits the current from second power line 410 to second subpixel 412, resulting in illumination of second subpixel 412, which in turn projects light onto the substrate. Alternatively, if state storage node 305 has no stored voltage, then drive gate 306 transmits no current from second power line 410 to second microLED subpixel 412, resulting in no illumination of second microLED subpixel 412, and no projection of light onto the substrate. Illumination or non-illumination of the microLED subpixels results in patterning of the substrate.

Because the substrate is moving at a velocity relative to the spatial light modulator, during the time delay between the first pulse and the second pulse, the position of the substrate relative to the microLED subpixels is different. The time delay may be equivalent to the distance between the two subpixels divided by the substrate velocity. The result is that the same place on the substrate is targeted twice by two different subpixels. The result is that a single programming effort results in two separate illuminations of subpixels over the same position on the substrate.

For example, if the subpixels are 1 micron apart, and the substrate moves at a velocity of 5 microns/second with respect to the spatial light modulator, the pulse delay is equivalent to 0.2 seconds. A person of ordinary skill in the art will understand that the substrate velocity may be in the hundreds of millimeters per second, so that the pulse delay is on the order of milliseconds, microseconds, or nanoseconds.

The embodiments disclosed herein confer several benefits. The embodiment contemplates two bursts of light that occur in the same location on the substrate without increased blurring or smearing. Because of the high data loads required to optimize processing speed, data efficiency is a high priority. With solid state emitter devices, data efficiency is a primary limiting factor in processing speed. For example, doubling or quadrupling the number of LEDs in an array increases the computational requirements by 2× or 4×. The embodiments described herein provide a method to decrease the data load required proportional to the number of storage nodes.

Another benefit of the embodiments disclosed herein may be improvement to the signal-to-noise ratio because of the redundancy inherent in the same location being illuminated twice. The resulting substrate pattern reflects the average of the two illuminations, which provides a statistical improvement in the uniformity of the pattern.

Another benefit of the embodiments disclosed herein is that the redundancy of shots compensates for variations that may exist in the light sources. For example, there may be variations in the thickness or dimensions of a microLED, resulting in variations in the brightness of the light emitted. This method adds redundancy of shots from each microLED, resulting in increased uniformity of the patterned substrate.

Another benefit is that because a single state capacitor bridges two subpixels, a single bit can control two pulses. The data-efficient approach reduces data input and output requirements because a single bit results in two or more exposures. Therefore, the redundancy benefits described above inure without the cost of computing and delivering additional bitmaps.

A person of ordinary skill in the art will understand that the number of subpixels may exceed two, and the number of pulses may also exceed two. A greater number of pulses will result in greater redundancy and therefore a more accurately patterned substrate. There is no practical limit to the number of pulses or number of subpixels: there could be two or ten or more subpixels and pulses per capacitor.

FIG. 6 is a schematic view of a solid state emitter array according to embodiments disclosed herein. Manufacture of solid state emitter devices typically results in an array 600 of solid state emitter devices arranged in rows 601 and columns 602. Such an array 600 allows broad application to the entire substrate of the specific benefits described above in a single pixel, wherein each single pixel has more than one microLED. Further, the array 600 allows for minor movements of the substrate relative to the array to result in patterning at a greater resolution than would be possible with a simple one capacitor-one subpixel solid state emitter device. By moving the substrate small distances as shown by arrow 603 relative to the solid state emitter array while applying frequent pulses of light, the efficiency of the patterning exceeds the efficiency available when simply patterning using previously known methods.

While the foregoing is directed to examples of the present disclosure, other and further examples of the disclosure may be devised without departing from the basic scope thereof, and the scope thereof is determined by the claims that follow.

What is claimed is:

1. A solid state emitter device for patterning a substrate, comprising:
   a program gate configured to deliver a voltage;
   a state storage node electrically connected to the program gate, wherein the state storage node is configured to store a voltage delivered by the program gate;
   a drive gate electrically connected to the state storage node, wherein the drive gate is activated when the state storage node stores a voltage delivered by the program gate to the state storage node;
   at least two power lines electrically connected to the drive gate; and
   a pixel comprising at least two subpixels, wherein each subpixel is electrically connected to the drive gate;
   wherein:
      upon delivery of a first electrical pulse from a first power line to the drive gate, the activated drive gate is configured to transmit the first electrical pulse to a first subpixel; and
      upon delivery of a second electrical pulse from a second power line to the drive gate, the activated drive gate is configured to transmit the second electrical pulse to a second subpixel; and
   wherein delivery of an electrical pulse to a subpixel causes illumination of the subpixel.

2. The device of claim 1, wherein the substrate is configured to move at a velocity relative to the subpixels.

3. The device of claim 2, wherein the first subpixel is separated from the second subpixel by a first distance.

4. The device of claim 3, wherein the delivery of the first electrical pulse and the delivery of the second electrical pulse are separated by a time delay.

5. The device of claim 4, wherein the time delay is equivalent to the first distance divided by the velocity of the substrate.

6. The device of claim 1, wherein:
   the program gate is in communication with a solid state programming device; and
   the solid state programming device is configured to determine whether to deliver a voltage to the program gate.

7. A solid state emitter array for patterning a substrate, comprising a plurality of solid state emitter devices, wherein each solid state emitter device comprises:
   a program gate configured to deliver a voltage;
   a state storage node electrically connected to the program gate, wherein the state storage node is configured to store a voltage delivered by the program gate;
   a drive gate electrically connected to the state storage node, wherein the drive gate is activated when the state storage node stores a voltage delivered by the program gate to the state storage node;

at least two power lines electrically connected to the drive gate; and a pixel comprising at least two subpixels, wherein each subpixel is electrically connected to the drive gate; wherein:

upon delivery of a first electrical pulse from a first power line to the drive gate, the activated drive gate is configured to transmit the first electrical pulse to a first subpixel; and upon delivery of a second electrical pulse from a second power line to the drive gate, the activated drive gate is configured to transmit the second electrical pulse to a second subpixel; and wherein delivery of an electrical pulse to a subpixel causes illumination of the subpixel.

8. The array of claim 7, wherein the plurality of solid state emitter devices are configured in rows and columns.

9. The array of claim 8, wherein the substrate is configured to move at a velocity relative to the array.

10. The array of claim 9, wherein each of the first subpixels is separated from each of the second subpixels by a first distance.

11. The array of claim 10, wherein the delivery of the first electrical pulse and the delivery of the second electrical pulse are separated by a time delay.

12. The array of claim 11, wherein the time delay is equivalent to the first distance divided by the velocity of the substrate.

13. The array of claim 7, wherein:

the array is in communication with a solid state programming device; and the solid state programming device is configured to determine whether to deliver a voltage to the program gate.

14. A method for patterning a substrate using a solid state emitter device, wherein the substrate is configured to move past the solid state emitter device at a velocity, comprising:

transmitting a voltage to a program gate connected to a state storage node;

transmitting the voltage from the program gate to the state storage node;

storing the voltage in the state storage node, wherein such storage activates a drive gate;

transmitting a first electrical pulse from a first power line to the drive gate, wherein the transmission of the first electrical pulse to the activated drive gate causes the first electrical pulse to pass through the drive gate and illuminate a first subpixel; and transmitting a second electrical pulse from a second power line to the drive gate, wherein the transmission of the second electrical pulse to the activated drive gate causes the second electrical pulse to pass through the drive gate and illuminate a second subpixel.

15. The method of claim 14, wherein a time delay separates the delivery of the first electrical pulse from the second electrical pulse.

16. The method of claim 15, wherein the time delay is equivalent to the distance between the first subpixel and the second subpixel divided by the velocity.

17. The method of claim 14, further comprising transmitting a third electrical pulse from a third power line to the drive gate, wherein the transmission of the third electrical pulse to the activated drive gate causes the third electrical pulse to pass through the drive gate and illuminate a third subpixel.

18. The method of claim 14, further comprising programming a device to determine whether to transmit a voltage to the program gate.

19. The method of claim 14, further comprising a plurality of solid state emitter devices arranged in an array opposite the substrate.

20. The method of claim 19, wherein the plurality of solid state emitter devices are arranged in rows and columns.

* * * * *